United States Patent [19]

Legrand et al.

[11] Patent Number: 4,666,226

[45] Date of Patent: May 19, 1987

[54] MINIATURE SMALL PITCH CONNECTION ELEMENT AND A PROCESS FOR MANUFACTURING SUCH A CONNECTION ELEMENT

[75] Inventors: Jacques Legrand, Paris; Jean C. Rouffy, Poissy, both of France

[73] Assignee: Socapex S.A., Suresnes, France

[21] Appl. No.: 795,073

[22] Filed: Nov. 4, 1985

[30] Foreign Application Priority Data

Nov. 6, 1984 [FR] France .............................. 84 16873

[51] Int. Cl.$^4$ .............................................. H01R 9/09
[52] U.S. Cl. ................................. 339/61 M; 29/883; 264/274; 339/17 M
[58] Field of Search ............ 339/17 M, 17 LM, 17 F, 339/59 M, 61 M, DIG. 3; 29/841, 848, 883, 884, 878, 874; 264/274

[56] References Cited

U.S. PATENT DOCUMENTS

| 3,795,884 | 3/1974 | Kotaka .......................... 339/17 LM |
| 3,991,463 | 11/1976 | Squitieri et al. ................. 339/17 M |
| 4,395,084 | 7/1983 | Conrad ................................. 29/884 |

FOREIGN PATENT DOCUMENTS

| 0001477 | 4/1979 | European Pat. Off. . |
| 2651186 | 5/1978 | Fed. Rep. of Germany . |
| 2192437 | 2/1974 | France . |

OTHER PUBLICATIONS

Proceedings of the S.I.D., vol. 21, No. 2, pp. 157–164, Los Angeles, U.S., L. S. Buchoff, "Metal Elastomeric Display Connectors".

*Primary Examiner*—Neil Abrams
*Attorney, Agent, or Firm*—Anibal Jose Cortina; Roger H. Criss

[57] ABSTRACT

A miniature small pitch connection element comprises an insulating elastomer body associated with conducting strips. The strips are disposed about the body over the largest part of its circumference and the remaining portion of the strips is overmolded by the body to be inside it to provide a strong mechanical connection between said strips and the body. The strips emerging from said body by their respective two ends.

20 Claims, 10 Drawing Figures

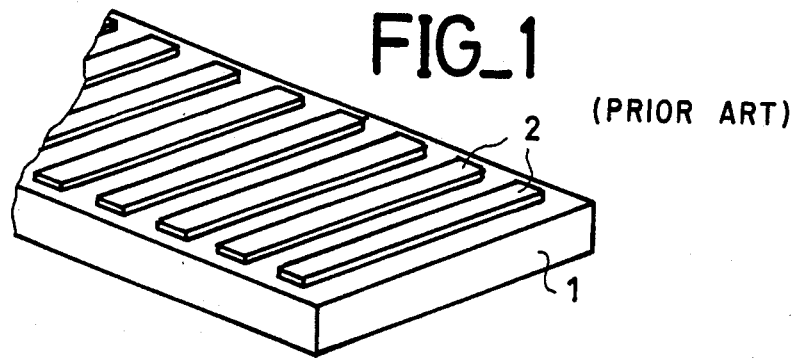
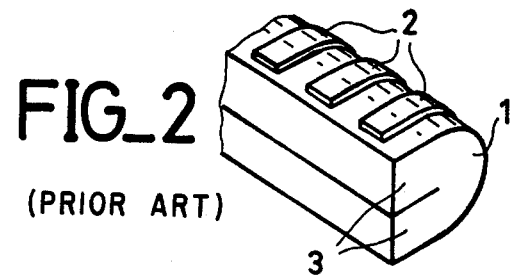
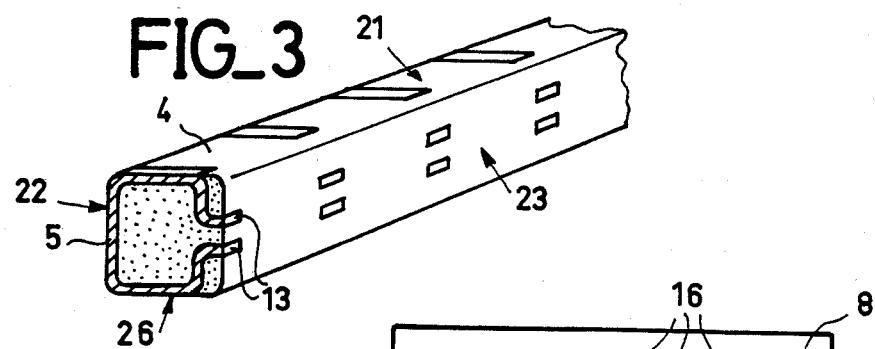
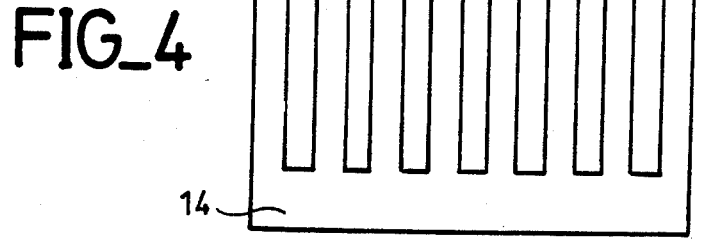

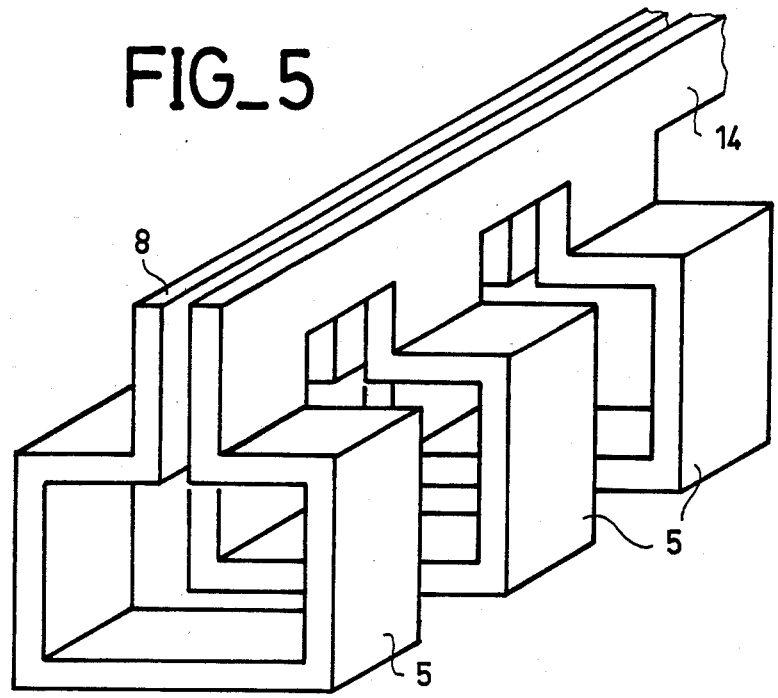
FIG_5
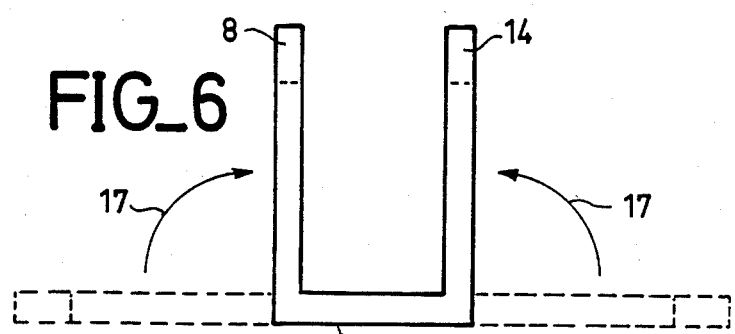
FIG_6
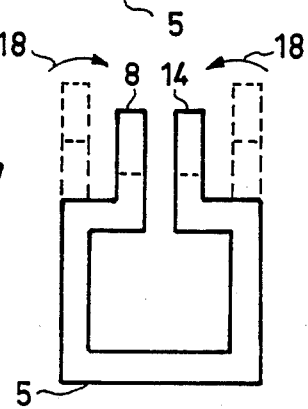
FIG_7

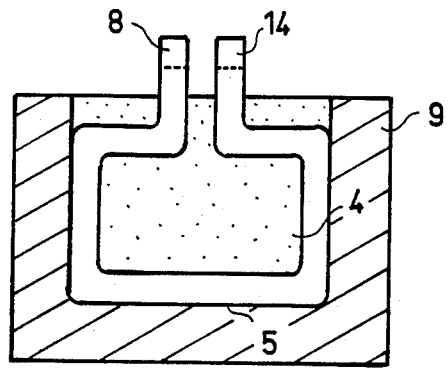
FIG_8
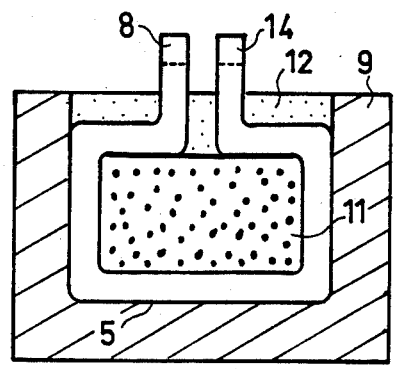
FIG_9
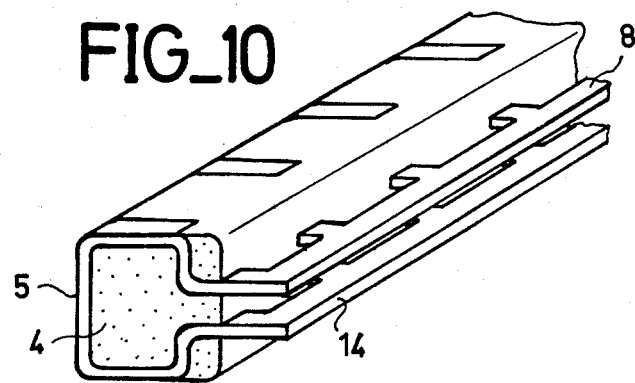
FIG_10

MINIATURE SMALL PITCH CONNECTION ELEMENT AND A PROCESS FOR MANUFACTURING SUCH A CONNECTION ELEMENT

BACKGROUND OF THE INVENTION

1. Field of the Invention

The invention relates to a miniature small pitch connection element intended for forming electrical connections in electronic systems. The greater and greater miniaturization and complexity of electronic components lead to the multiplication of the conducting connections on restricted surfaces.

2. Description of the Prior Art

The needs for connecting components on printed circuit cards, or such cards together, have led to a new connector technology based on the use of the resilient properties of elastomers.

A device of the prior art, described in European patent No. 0 001 477, is a connector in which metal parts are placed about an elastomer body in the form of bent tracks. This connector comprises an elongate body made from an insulating elastomer material of uniform cross section and which has two opposite flat and parallel faces connected together on one side by a convex surface. Several conducting paths are disposed on this body, each of these paths comprising a contact part on each of these two opposite faces of the body and a part extending along the convex surface between these contact parts. Such conducting parts are formed from a strip of insulating elastomer material obtained by printed circuit techniques and bent so as to form the desired product. This technique improves the reliability after compression of the connection element, but involves delicate operations, on the one hand because, of the necessarily reduced dimensions and so of the accurate positioning of the conducting parts and, on the other hand, because of the soundness of the securing of the metal parts to the elastomer, since they are not surrounded by the insulating material.

The present invention overcomes these drawbacks by a technology which allows a less complex implementation while ensuring a good metal-elastomer connection and a high level of reliability after repeated compressions.

SUMMARY OF THE INVENTION

The invention provides a miniature small pitch connection element comprising an insulating elastomer body of square, rectangular, circular or any other section allowing after compression a good electrical contact in association with conducting wires to be obtained, wherein said wires are disposed about said body over the greatest part of its circumference and thereinside over the rest so as to provide a strong mechanical connection between said wires and said body, said wires emerging from said body by their two ends.

The invention further provides a process for manufacturing such a connection element.

BRIEF DESCRIPTION OF THE DRAWINGS

The invention will be better understood from reading the following description given by way of non limitative example, with reference to the figures wherein:

FIGS. 1 and 2, are two views illustrating the construction of a connector in the prior art;

FIG. 3, is a view of the connector of the invention; and

FIGS. 4 to 10, are views illustrating the construction of the connector of the invention.

DETAILED DISCUSSION AND DESCRIPTION OF THE PREFERRED EMBODIMENTS

FIGS. 1 and 2 illustrate two steps in constructing a connector of the known art.

FIG. 1 shows a strip 1 of an insulating material which comprises several conducting paths 2, parallel to each other, disposed on one of its faces. In this device of the prior art, the strip is bent, as shown in FIG. 2, along a longitudinal median so as to form a "U" comprising the conducting paths of its external faces 3. This "U" is then closed on itself by applying a pressure between the external faces 3. The connection between the two legs of the "U" may, for example be provided by heating, using an elastomeric material having thermoplastic properties.

In contrast, the connector of the invention consists of a small pitch miniature connection element formed from the association of conducting strips or wires and an insulating elastomeric body, the strips or wires being positioned such that they pass around the insulating body over the greatest part of its circumference and penetrate thereinto over the rest so as to provide a strong mechanical connection between these two parts of the composite, namely the conducting strips or wires and the insulating body.

A configuration of the invention is shown in FIG. 3. The conducting strips 5 are associated with the insulating elastomer 4 which provides both electric insulation of the conducting strips 5 and the function of a mechanical spring. By way of example, these conducting strips may be made from copper or a copper alloy and the insulating body from a silicon elastomer.

The conducting strips 5 are outside the elastomer body on three of its faces 21, 22 and 26. They are internal to the insulating body on the fourth face 23 from which they only emerge by their ends 13. Such metal strips, so as to provide a good electric contact, are preferably coated with a layer of gold, with a superimposition of two nickel and gold layers, with a layer of tin-lead alloy, a layer of palladium or any other coating known to a man skilled in the art, for improving the reliability of the electical contact. The chemical connection which is to provide adhesion thereof to the elastomeric body is difficult to obtain in the case of a gold layer. Thus, the part penetrating into the elastomer allows positioning of the metal conductors to be maintained while reinforcing it.

By way of example, the elastomeric body may be a parallelepiped of square section having sides of 3 mm. The metal strips may have a width of 0.2 mm spaced apart by 0.4 mm and a thickness of 0.1 mm. The preferred construction will consist of starting with a wide band in which the conducting strips are cut out either mechanically or by photochemical etching to their final dimensions.

FIG. 4 shows how parallel conducting parts 5 are cut out. These conducting parts 5 are held in parallel relation by two continuous edges 8 and 14 remaining from the original band and separated by gaps 16. Thus, they can be handled without modifying their positions which are fixed once and for all from the outset, and in addition, continuous automatic cutting technologies may be employed for this phase of the product which is in the form of a band of great length which can be wound on a reel.

The second phase is the transverse bending of the band such as shown in FIG. 5. This operation is carried out preferably in two steps on formers such as shown schematically in FIGS. 6 and 7 with folding directions 17 and 18. The two folds, illustrated by arrows 18, are effected in a zone of the band where it is cut into strips 5 and not in the region of edges 8 and 14.

Edges 8 and 14 ensure the mechanical strength and positioning of the assembly. Furthermore, they connect all the contacts electrically together, which allows the electric current to be distributed therein during electrolysis operations.

The electrolytic coatings are therefore greatly facilitated by this configuration. They may be carried out before or after folding in the configuration of FIG. 4 or FIG. 5.

By way of example, the metal parts will be coated with a layer of about 2 microns of nickel on which 1 micron of gold will be deposited. The next phase consists of placing the cut out grid in a mold whose internal configuration is designed so that the conducting elements 5 bear against the walls as shown in FIG. 8. The elastomer 4 is polymerized in the mold so as to coat completely only the closely spaced parts of the grid. The parts intended to provide the contact must remain bare on their external surface.

The bearing force which they exert on the walls of the mold at the time of inserting the grid into the mold is intended to prevent polymerization on the external faces.

This action is reinforced by the use of a mold coated with rubber which is non adherent to the elastomer 4 used.

Another technique is shown in FIG. 9. A parallelepiped 11 of prepolymerized elastomer is placed in the series of parallel rings formed by the strips. The whole is introduced into the mold 9. Molding is completed then by polymerization of the same type of elastomer at 12. The parts 12 and 11 formed, for example, from the same material have excellent adherence, for example, being made, for example, from silicone.

The invention is then as shown in FIG. 10 and it only remains to cut edges 8 and 14 so as to have the final product shown in FIG. 3.

It should be noted that it may be advantageous to carry out the electrolytic treatments only before this last step. The technology of the invention offers then the possibility of forming coatings solely on the useful external zones, which is a source of economy in the case of using precious metals such as gold.

The composite of the invention may be used in numerous connection configurations. In order to establish the connection, it is sufficient to press it against the rigid planes comprising the tracks to be connected. These planes are either printed circuit cards, or components for flat transfer such as chip carriers.

The composite will therefore be preferably inserted in a rigid insulating element which will position it, the whole forming the connector.

What is claimed is:

1. A miniature small pitch connection element comprising an insulating elastomer body associated with conducting strips, wherein said strips are spaced from each other an amount sufficient to prevent electrical intercontact, and are continuously disposed about and in contact with said body over the greatest part of its circumference and having their outer surfaces overmolded by and fully enclosed by the insulating elastomer body over the rest of said strips so as to provide a strong mechanical connection between said strips and said body, and with said strips emerging from said body, at a single substantially flat surface of the body at their two ends to be flush with the single surface of the body whereby said strips define electrical contacts for said connection element to interconnect electrical components and whereby as a result of the two ends of the strip emerging at and being flush with the single surface the connection between the body and the strips is enhanced.

2. The connection element as in claim 1, wherein the insulating elastomer is made of silicone.

3. The connection element is in claim 1, wherein said strips are formed from copper or copper alloy.

4. The connection element as in claim 1, wherein said strips are coated with a conductive metal coating for ensuring reliability of electrical contact whenin use as a connector.

5. The connection element as in claim 1, wherein said insulating body is shaped like a parallelepiped having a rectangular cross-section.

6. The connection element as in claim 5 wherein the parallelepiped shaped body has a square cross-section.

7. The connection element as in claim 6 wherein the length of the sides of the square is about 3 mm, the strips have a width of about 0.2 mm, are spaced from each other by about 0.4 mm and have a thickness of about 0.1 mm.

8. The connection element as in claim 1 wherein the strips are made of copper coated with a layer of gold.

9. The connection element as in claim 1 wherein the strips are made of copper coated with, in sequence, two nickel layers with a gold layer superimposed thereon.

10. The connection element as in claim 1 wherein the strips are made of copper coated with a layer of tin-lead alloy.

11. The connection element as in claim 1 wherein the strips are made of copper coated with a layer of palladium.

12. The connection element as in claim 9 wherein the thickness of the nickel coating is about 2 and the thickness of the gold coating is about 1.

13. A process for manufacturing a connection element which comprises an insulating elastomer body associated with conductive strips, each of which have two ends, wherein said strips are spaced from each other and are disposed about and in contact with said body over the greatest part of its circumference and overmolded by and inside the insulating elastomer body over the rest of said strips so as to provide a strong mechanical connection between said strips and said body, and with said strips emerging from said body at their two ends whereby said strips define electrical contacts for said connection element to interconnect electrical components, said method comprising the steps of:

cutting out a band of conducting material in a manner such as to obtain a series of strips which are parallel to each other, are separated by gaps and are interconnected together at ends thereof by two continuous borders;

transversely folding said band, while holding it by its two continuous borders to form rings with said strips which are almost closed;

introducing said band into a mold in a position such that the outer faces of the strips bear against walls of said mold;

introducing and polymerizing an elastomer in said mold in a manner such that this upper level of the elastomer below the attachment location of said strips to said continuous bands; and cutting off the bands at said attachment location at a point flush with the elastomer body.

14. The process as in claim 13, further comprising an electrolytic coating step for coating said strips with a conductive material.

15. The process as in claim 14, wherein said electrolytic coating step is carried out before the folding step.

16. The process is in claim 14, wherein said electrolytic coating step is carried out before the step of introducing the band into a mold.

17. The process as in claim 14, wherein said electrolytic coating step is carried out before the step of cutting the borders of the band.

18. The process is in claim 14, wherein said electrolytic coating step comprises a step of depositing a layer of nickel then a step of depositing a layer of gold.

19. A process as in claim 13, further comprising before introducing the band into the mold, inserting a prepolymerized elastomer parallelepiped in the rings formed by the strips of the band, and then introducing the ring and parallelepiped assembly into the mold.

20. The process as in claim 13 wherein said mold is coated on the interior surfaces thereof with a rubber which is nonadherent to said elastomer introduced and polymerized therein.

* * * * *